(12) United States Patent
Hatase

(10) Patent No.: US 8,675,367 B2
(45) Date of Patent: Mar. 18, 2014

(54) MODULE INCORPORATING ELECTRONIC COMPONENT

(75) Inventor: Minoru Hatase, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 23 days.

(21) Appl. No.: 13/420,636

(22) Filed: Mar. 15, 2012

(65) Prior Publication Data

US 2012/0175161 A1    Jul. 12, 2012

Related U.S. Application Data

(63) Continuation of application No. PCT/JP2010/066057, filed on Sep. 16, 2010.

(30) Foreign Application Priority Data

Sep. 16, 2009    (JP) .................................. 2009-213896

(51) Int. Cl.
*H05K 1/18*    (2006.01)

(52) U.S. Cl.
USPC ........... 361/760; 361/767; 361/777; 174/260; 174/261

(58) Field of Classification Search
USPC .......... 174/260–262; 361/760, 792–795, 767, 361/777; 257/778, 787
See application file for complete search history.

(56) References Cited

U.S. PATENT DOCUMENTS

| 6,853,089 | B2 * | 2/2005 | Ujiie et al. ..................... 257/783 |
| 7,790,270 | B2 * | 9/2010 | Tomita et al. .................. 428/210 |
| 7,880,091 | B2 * | 2/2011 | Miyamoto et al. ............. 174/255 |
| 8,101,864 | B2 * | 1/2012 | Chinda et al. .................. 174/255 |
| 8,336,201 | B2 * | 12/2012 | Choi et al. ....................... 29/840 |
| 2005/0206016 | A1 * | 9/2005 | Shohji et al. ................... 257/787 |
| 2006/0225918 | A1 * | 10/2006 | Chinda et al. .................. 174/260 |

(Continued)

FOREIGN PATENT DOCUMENTS

| JP | 63-10582 U | 1/1988 |
| JP | 06-177518 A | 6/1994 |

(Continued)

OTHER PUBLICATIONS

Official Communication issued in corresponding Japanese Patent Application No. 2011-531963, mailed on Dec. 11, 2012.

(Continued)

*Primary Examiner* — Hoa C Nguyen
*Assistant Examiner* — Amol Patel
(74) *Attorney, Agent, or Firm* — Keating & Bennett, LLP

(57) ABSTRACT

A module incorporating electronic component includes a substrate, a wiring pattern located on at least one surface of the substrate, at least one electronic component electrically bonded to the wiring pattern, and bonded to the substrate, and a sealing resin arranged to cover the surface of the substrate including the bonded electronic component. The wiring pattern includes a plurality of land electrodes, and electrically bonded to the electronic component or a via conductor, and a wiring electrode arranged to connect the land electrodes, and an insulating resin is disposed on the wiring electrode except for a boundary between the land electrode and the wiring electrode, so as to cross at least one boundary between the substrate and the wiring electrode such that an adhesion strength between the insulating resin and the sealing resin is higher than an adhesion strength between the insulating resin and the wiring pattern.

10 Claims, 5 Drawing Sheets

(56) References Cited

U.S. PATENT DOCUMENTS

| | | | | |
|---|---|---|---|---|
| 2006/0244131 | A1* | 11/2006 | Kobayashi et al. | 257/724 |
| 2009/0236136 | A1* | 9/2009 | Chiang | 174/261 |
| 2010/0116534 | A1* | 5/2010 | Choi et al. | 174/260 |
| 2011/0095421 | A1* | 4/2011 | Kim et al. | 257/737 |

FOREIGN PATENT DOCUMENTS

| | | | |
|---|---|---|---|
| JP | 06177518 A * | 6/1994 | |
| JP | 2000-068644 A | 3/2000 | |
| JP | 2004-186362 A | 7/2004 | |
| JP | 2005-183430 A | 7/2005 | |
| JP | 2006-310629 A | 11/2006 | |

OTHER PUBLICATIONS

Official Communication issued in International Patent Application No. PCT/JP2010/066057, mailed on Oct. 12, 2010.

* cited by examiner

MODULE INCORPORATING ELECTRONIC COMPONENT

BACKGROUND OF THE INVENTION

1. Field of the Invention

The present invention relates to a module incorporating electronic component, and more particularly to a module incorporating electronic component including a structure that covers an electronic component bonded onto a substrate with a sealing resin.

2. Description of the Related Art

Recently, a module incorporating electronic component in which a plurality of electronic components are bonded onto a substrate at high density has been widely spread. The module incorporating electronic component is variously developed such that the bonded electronic components are covered with a metal case, or the bonded electronic components are covered with a sealing resin. Especially, in the case where the bonded electronic components are covered with the sealing resin, when bonding strength between the sealing resin and the substrate is increased, reliability of the module incorporating electronic component can be improved. Here, in a case where a wiring pattern and the electronic component are provided on the substrate, the bonding strength between the sealing resin and the substrate can be determined by combining adhesion strength between the sealing resin and the substrate, adhesion strength between the sealing resin and the wiring pattern, and adhesion strength between the sealing resin and the electronic component.

Japanese Unexamined Patent Publication No. 2005-183430 discloses a module incorporating electronic component in which a bonding strength between a sealing resin and a substrate is increased. The module incorporating electronic component disclosed in Japanese Unexamined Patent Publication No. 2005-183430 has at least one electronic component, an electrode to bond the electronic component to a surface layer, and a solder resist, and includes a wiring substrate having one or more wiring layers, and an insulating resin (sealing resin) to cover the electronic component electrically bonded (connected) to the electrode on the wiring substrate with a solder. According to the module incorporating electronic component disclosed in the Japanese Unexamined Patent Publication No. 2005-183430, a limited portion or an entirety of the solder resist provided in an outer periphery of the wiring substrate is removed, and the wiring substrate from which the solder resist has been removed is directly bonded and adhered to the insulating resin (sealing resin). Since adhesion strength between the insulating resin (sealing resin) and the wiring substrate is higher than an adhesion strength between the insulating resin (sealing resin) and the solder resist, the bonding strength between the insulating resin (sealing resin) and the substrate is increased by enlarging the part from which the solder resist is removed.

According to the module incorporating electronic component disclosed in the Japanese Unexamined Patent Publication No. 2005-183430, since the solder resist is formed on one surface of the wiring substrate, except for the outer periphery of the wiring substrate from which a limited portion or an entirety of the solder resist has been removed, an interface between the insulating resin (sealing resin) and the solder resist, and an interface between the solder resist and the wiring substrate exist over a wide range of the one surface of the wiring substrate. In general, it is known that a defect regarding the solder, for example, such as solder splash in which the solder is melted again due to heat in a soldering process and oozes between a fine gap, or a short circuit caused under the component, is generated at an interface between different kinds of materials.

Therefore, according to the module incorporating electronic component disclosed in the Japanese Unexamined Patent Publication No. 2005-183430, the interface between the insulating resin (sealing resin) and the solder resist, and the interface between the solder resist and the wiring substrate, exist over the wide range of the one surface of the wiring substrate as the interface between the different kinds of materials, so that the defect regarding the solder such as the solder splash could be generated there.

SUMMARY OF THE INVENTION

In view of the above circumstances, preferred embodiments of the present invention provide a module incorporating electronic component in which a bonding strength between a sealing resin and a substrate is increased to prevent defect relating to solder, such as solder splash, from being generated.

According to a first preferred embodiment of the present invention, a module incorporating electronic component includes a substrate, a wiring pattern provided on at least one surface of the substrate, at least one electronic component electrically bonded to the wiring pattern, and bonded to the substrate, and a sealing resin arranged to cover the surface of the substrate including the bonded electronic component, in which the wiring pattern includes a plurality of land electrodes electrically bonded to the electronic component or a via conductor, and a wiring electrode arranged to connect the land electrodes, and an insulating resin is provided on the wiring electrode except for a boundary between the land electrode electrically bonded to the electronic component, and the wiring electrode, so as to cross at least one boundary between the substrate and the wiring electrode such that an adhesion strength between the insulating resin and the sealing resin is higher than an adhesion strength between the insulating resin and the wiring pattern.

According to the first preferred embodiment of the present invention, since the insulating resin is provided on the wiring electrode except for the boundary between the land electrode electrically bonded to the electronic component, and the wiring electrode, so as to cross at least one boundary between the substrate and the wiring electrode such that the adhesion strength between the insulating resin and the sealing resin is higher than the adhesion strength between the insulating resin and the wiring pattern, the bonding strength between the sealing resin and the substrate can be increased. The insulating resin is arranged so as to cross at least one boundary between the substrate and the wiring electrode to increase the bonding strength between the sealing resin and the substrate. As a result, defects relating to solder, such as solder splash, are reliably prevented from being generated in an interface between the sealing resin and the substrate.

In another preferred embodiment of the present invention, the insulating resin preferably has a linear shape. As a result, the bonding strength between the sealing resin and the substrate can be increased in a direction substantially perpendicular to a longitudinal direction of the linear shape. Since the insulating resin is linearly shaped, a range of an interface between the sealing resin and the insulating resin, and an interface between the insulating resin and the wiring pattern which are interfaces of the different kinds of materials can be limited and defects relating to solder, such as solder splash, are reliably prevented from being generated at the interface between the different kinds of materials.

In a further preferred embodiment of the present invention, the insulating resin is configured such that an area of an adhesion range with the substrate is larger than an area of an adhesion range with the wiring electrode. As a result, the area of the adhesion range between the substrate and the insulating resin whose adhesion strength is higher than the adhesion strength between the wiring electrode and the insulating resin is largely provided, so that the bonding strength between the sealing resin and the substrate is further increased.

In another preferred embodiment of the present invention, the insulating resin is located on the substrate at a position where the wiring pattern is not located. As a result, an adhesion strength between the sealing resin and the substrate is reinforced in the position in which the wiring pattern is not located, so that the bonding strength between the sealing resin and the substrate is increased.

According to an additional preferred embodiment of the present invention, the insulating resin is preferably made of a solder resist. As a result, the insulating resin can be formed in the same production process as a production process to form a solder outflow prevention pattern to prevent the solder used to electrically bond the electronic component to the land electrode from outflowing to the wiring electrode. Therefore, production costs thereof can be reduced.

A module incorporating electronic component according to various preferred embodiments of the present invention includes the substrate, the wiring pattern provided on at least one surface of the substrate, at least one electronic component electrically bonded to the wiring pattern, and bonded to the substrate, and the sealing resin arranged to cover the surface of the substrate including the bonded electronic component, in which the wiring pattern includes the plurality of land electrodes electrically bonded to the electronic component or the via conductor, and the wiring electrode to connect the land electrodes, and the insulating resin is disposed on the wiring electrode except for the boundary between the land electrode electrically bonded to the electronic component, and the wiring electrode, so as to cross at least one boundary between the substrate and the wiring electrode such that the adhesion strength between the insulating resin and the sealing resin is higher than the adhesion strength between the insulating resin and the wiring pattern, so that the bonding strength between the sealing resin and the substrate can be increased. The insulating resin is arranged so as to cross at least one boundary between the substrate and the wiring electrode to increase the bonding strength between the sealing resin and the substrate, such that defects relating to solder, such as solder splash, are reliably prevented from being generated at the interface between the sealing resin and the substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a detailed description will be made of a module incorporating electronic component according to preferred embodiments of the present invention with reference to the drawings. The following preferred embodiments do not limit the present invention described in claims, and all combinations of various characteristics, features, elements, etc. described with respect to preferred embodiments are not always necessary or indispensable.

Figure 1:
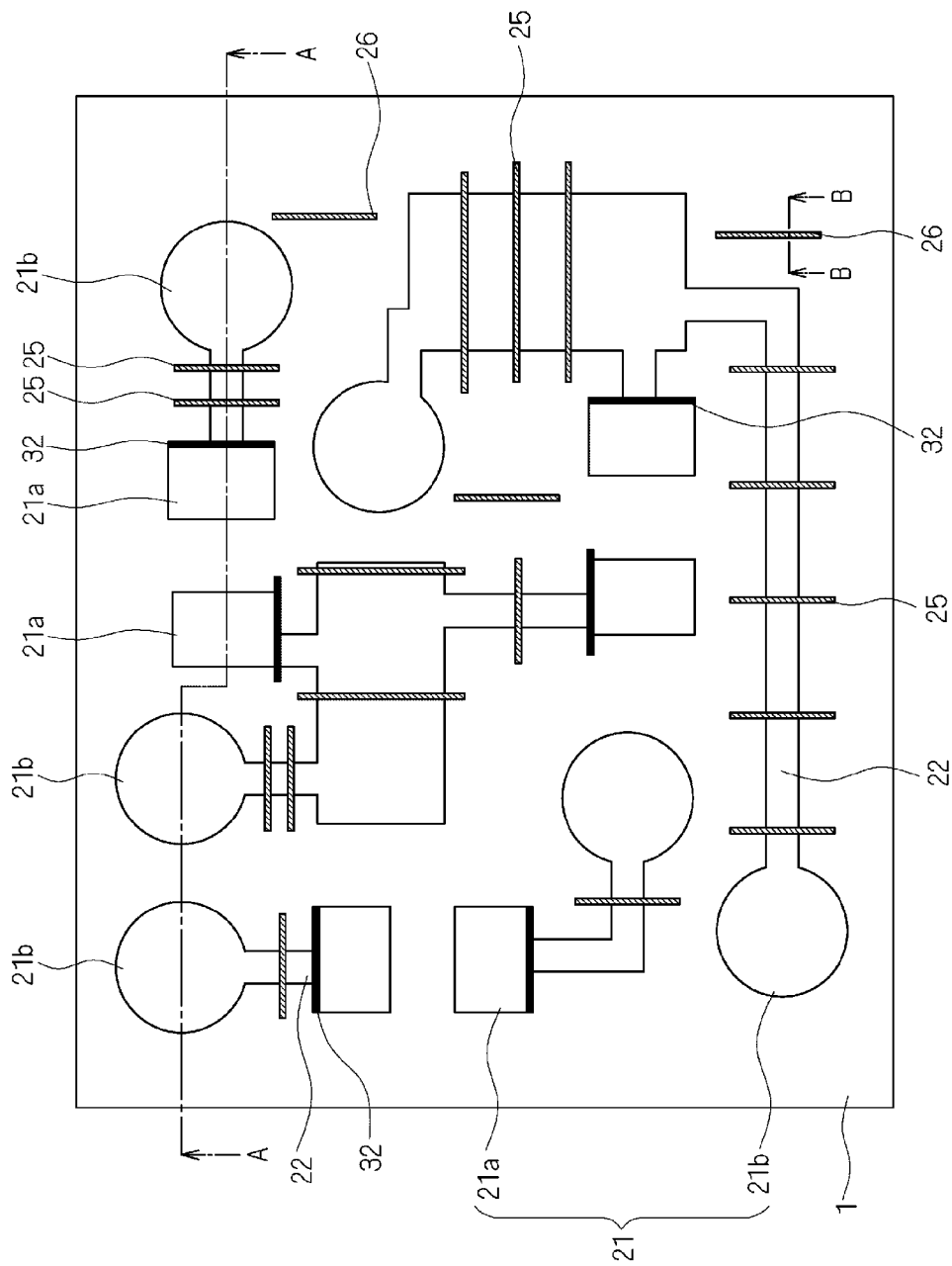
FIG. 1 is a plan view of a substrate of a module incorporating electronic component according to a preferred embodiment of the present invention.
Figure 2:
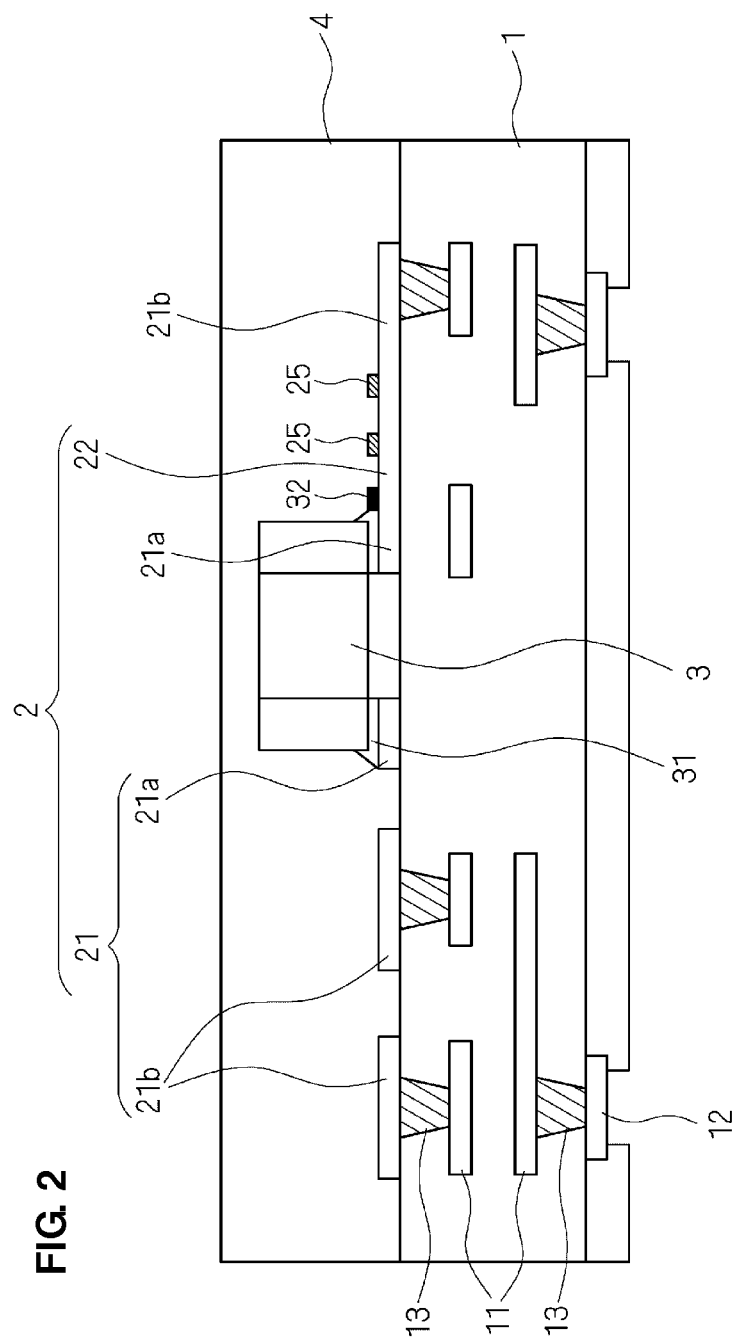
FIG. 2 is a schematic view in a cross section taken along A-A of the module incorporating electronic component shown in FIG. 1.

FIG. 1 is a plan view of a substrate of the module incorporating electronic component according to a preferred embodiment of the present invention. FIG. 2 is a schematic view of a cross section taken along A-A of the module incorporating electronic component shown in FIG. 1. As shown in FIG. 2, the module incorporating electronic component according to the present preferred embodiment of the present invention includes a substrate 1, a wiring pattern 2 located on at least one surface of the substrate 1, at least one electronic component 3 electrically bonded to the wiring pattern 2, and bonded to the substrate 1, and a sealing resin 4 which covers the surface of the substrate 1 to which the electronic component 3 is bonded.

The substrate 1 preferably is a wiring substrate which is generally used, and a plurality of wiring layers 11 are formed therein. The substrate 1 includes an electrode 12 to be connected to another substrate or the like, on a surface on the opposite side of the surface having the bonded electronic component 3. The wiring pattern 2 provided on at least one surface of the substrate 1, the plurality of wiring layers 11 provided inside the substrate 1, and the electrode 12 provided on the surface on the opposite side of the surface bonded to the electronic component 3 are electrically bonded by a via conductor 13 as needed, respectively. The substrate 1 is not limited to the case where the electrode 12 is formed on the surface on the opposite side of the surface having the bonded electronic component 3, so that the wiring pattern 2 may be provided on the surface on the opposite side of the surface including the bonded electronic component 3 and the electronic component 3 may be bonded thereto.

The wiring pattern 2 includes a plurality of land electrodes 21 electrically bonded to the electronic component 3 or the via conductor 13, and a wiring electrode 22 to connect the land electrodes 21. The land electrode 21 includes a land electrode 21a electrically bonded to the electronic component 3, and a land electrode 21b electrically bonded to the via conductor 13. The land electrode 21a is electrically bonded to the electronic component 3 with a conductive bonding material such as a solder 31. More specifically, the electronic component 3 is arranged so as to cross a portion between the adjacent land electrodes 21a, and the land electrode 21a and a terminal of the electronic component 3 are electrically bonded with the solder 31. In the case where the land electrode 21a and the terminal of the electronic component 3 are bonded with the solder 31, a solder outflow prevention pattern 32 is preferably formed of a solder resist at a boundary between the land electrode 21a and the wiring electrode 22, in order to prevent the solder 31 provided on the land electrode 21 from outflowing to the wiring electrode 22 connected to the land electrode 21a. As for the land electrode 21b, besides being electrically bonded to the wiring layer 11 disposed in the substrate 1 through the via conductor 13, it may be electrically bonded to a wiring pattern (not shown) disposed on the sealing resin 4 while providing a via conductor (not shown) in the sealing resin 4.

As shown in FIG. 1, the land electrode 21a is preferably rectangular or substantially rectangular, for example, so as to be easily electrically bonded to the electronic component 3, and the land electrode 21a is bonded to the terminal of the electronic component 3 with the solder 31, so that the solder outflow prevention pattern 32 is linearly arranged at the boundary with the wiring electrode 22. The land electrode 21b is preferably circular or substantially circular so as to be easily electrically bonded to the via conductor 13, and connected to the land electrode 21a through the wiring electrode 22. A plurality of insulating resins 25 are linearly arranged on the wiring electrode 22 except for the boundary between the land electrodes 21a, and 21b, and the wiring electrode 22, so as to cross at least one boundary between the substrate 1 and the wiring electrode 22. Adhesion strength between the insulating resin 25 and the sealing resin 4 is set so as to be preferably higher than the adhesion strength between the insulating resin 25 and the wiring pattern 2.

Since adhesion strength between the wiring pattern 2 (such as the wiring electrode 22) and the sealing resin 4 is less than adhesion strength between the substrate 1 and the sealing resin 4, the sealing resin 4 could be peeled off the wiring pattern 2 in a range of the wiring pattern 2 provided on the substrate 1. Thus, the insulating resin 25 which is higher in adhesion strength with the sealing resin 4 than the wiring pattern 2 is linearly arranged on the wiring electrode 22 in order to increase bonding strength between the sealing resin 4 and the substrate 1. That is, since the adhesion strength between the insulating resin 25 and the sealing resin 4 is higher than the adhesion strength between the wiring pattern 2 and the sealing resin 4, the insulating resin 25 provided on the wiring electrode 22 functions as an anchor to connect the sealing resin 4 and the substrate 1. In a case in which the adhesion strength between the insulating resin 25 and the wiring electrode 22 is higher than the adhesion strength between the sealing resin 4 and the wiring electrode 22, the insulating resin 25 is not necessarily arranged to cross the boundary between the substrate 1 and the wiring electrode 22, so that the insulating resin 25 may be provided only on the wiring electrode 22.

The linear insulating resin 25 increases the bonding strength between the sealing resin 4 and the substrate 1 in a direction substantially perpendicular to a linear longitudinal direction. Since the adhesion strength between the wiring pattern 2 and the sealing resin 4 is lower than the adhesion strength between the insulating resin 25 and the sealing resin 4, the sealing resin 4 is likely to peel off in a direction in which the wiring pattern 2 is arranged (longitudinal direction of the wiring electrode 22). Therefore, the linear insulating resin 25 is arranged in the direction that is substantially perpendicular to the longitudinal direction of the wiring electrode 22, so that the bonding strength between the sealing resin 4 and the substrate 1 can be increased. A range of an interface between the sealing resin 4 and the insulating resin 25, and an interface between the insulating resin 25 and the wiring pattern 2 which are interfaces between different kinds of materials is limited, and a defect regarding the solder such as solder splash is prevented from being generated in the interface between the different kinds of materials. The shape of the insulating resin 25 is not limited to the linear shape, and it may be in the form of another shape such as a dashed line, rectangle, or circle, for example, as long as it can increase the bonding strength between the sealing resin 4 and the substrate 1, and limit the range of the interface between the sealing resin 4 and the insulating resin 25 and the interface between the insulating resin 25 and the wiring pattern 2 which are the interfaces between the different kinds of materials. That is, the insulating resin 25 is preferably arranged to be in contact with both of the wiring electrode 22 and the substrate 1. The linear insulating resin 25 and the sealing resin 4 are adhered to each other not only on a surface parallel or substantially parallel to the substrate 1, but also on a surface (side surface) vertical to the substrate 1, so that the bonding strength between the sealing resin 4 and the substrate 1 can be further increased. The direction in which the insulating resin 25 is arranged is not limited to the direction substantially perpendicular or substantially perpendicular to the longitudinal direction of the wiring electrode 22, and it may be another direction.

The insulating resin 25 is arranged so as to cross at least one boundary between the substrate 1 and the wiring electrode 22. Since the adhesion strength between the insulating resin 25 and the substrate 1 is higher than the adhesion strength between the insulating resin 25 and the wiring electrode 22, the bonding strength between the sealing resin 4 and the substrate 1 can be further increased in the case where the insulating resin 25 is arranged so as to cross at least one boundary between the substrate 1 and the wiring electrode 22, compared to the case where it is provided only on the wiring electrode 22. The insulating resin 25 may be arranged to cross only one side of the boundaries between the substrate 1 and the wiring electrode 22, or may be arranged so as to cross both sides of the boundaries between the substrate 1 and the wiring electrode 22.

Figure 3:
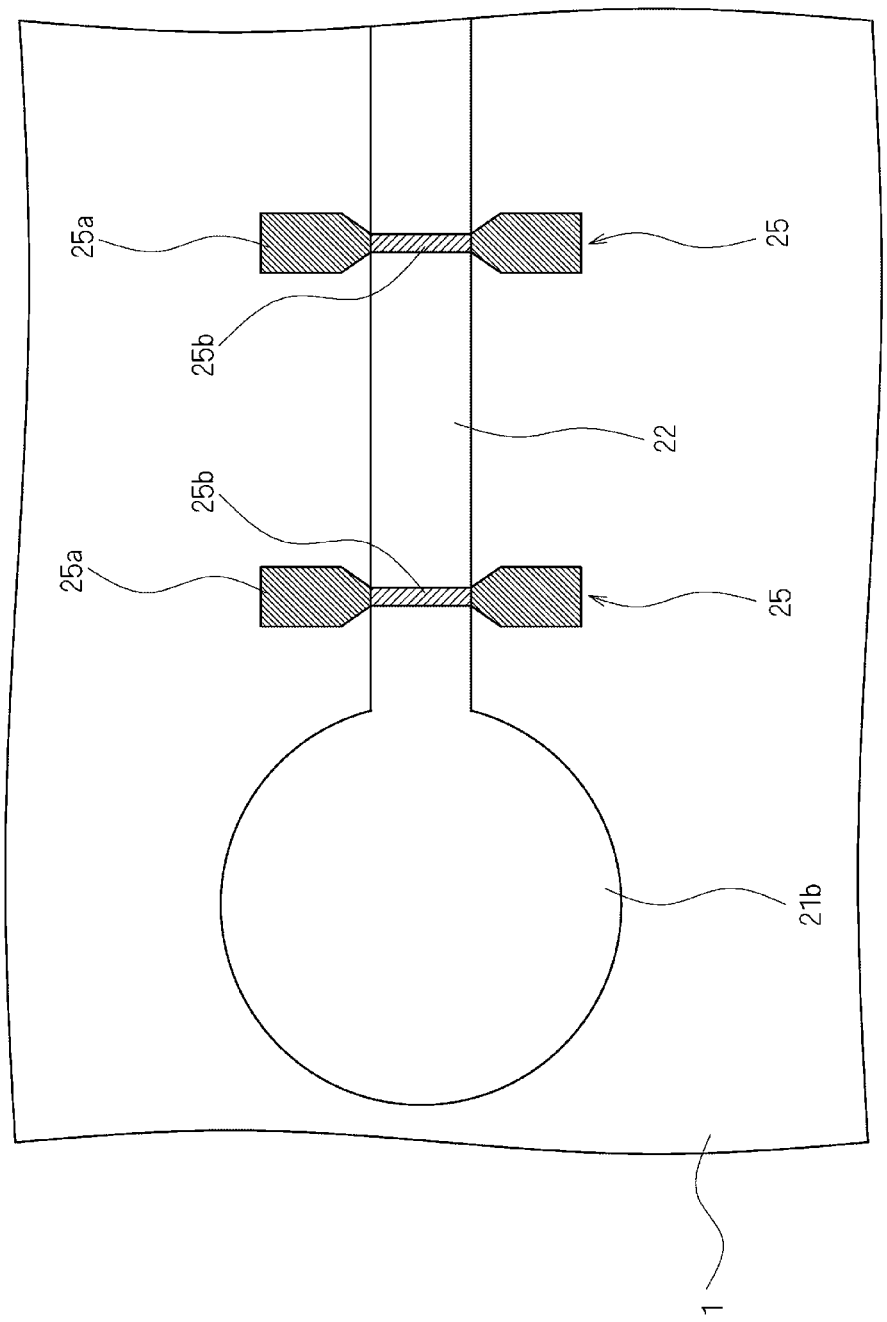
FIG. 3 is a schematic view showing a configuration of an insulating resin in which an area of an adhesion range with a substrate is larger than an area of an adhesion range with a wiring electrode.

The insulating resin 25 preferably has a configuration such that an area of an adhesion range with the substrate 1 is larger than an area of an adhesion range with the wiring electrode 22. FIG. 3 is a schematic view showing a configuration of the insulating resin 25 having a configuration in which the area of the adhesion range with the substrate 1 is larger than the area of the adhesion range with the wiring electrode 22. As shown in FIG. 3, since the insulating resin 25 preferably has a configuration such that an area 25a of the adhesion range with the substrate 1 is larger than an area 25b of the adhesion range with the wiring electrode 22, the area 25a of the adhesion range between the substrate 1 and the insulating resin 25 whose adhesion strength is higher than the adhesion strength between the insulating resin 25 and the wiring electrode 22 is largely provided, so that the bonding strength between the sealing resin 4 and the substrate 1 is even further increased.

Figure 4:
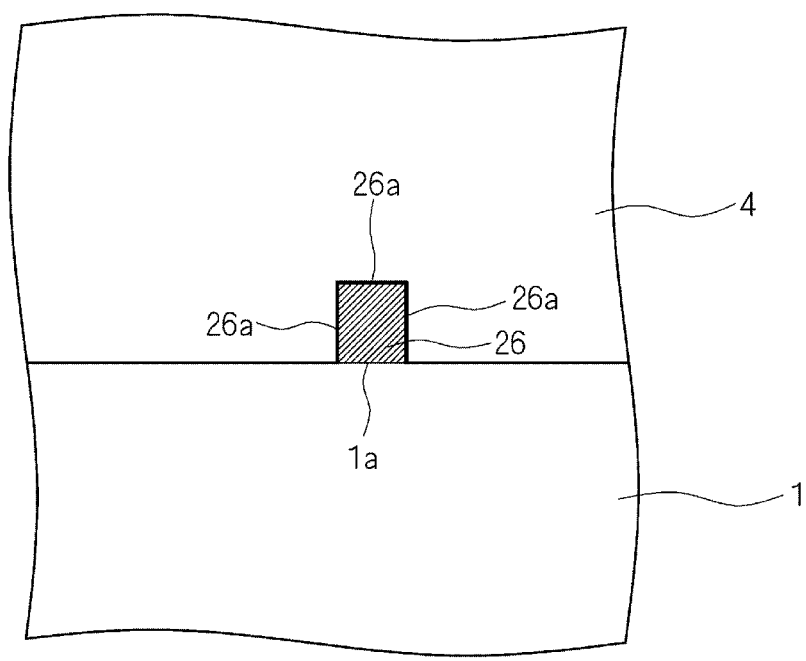
FIG. 4 is a schematic view in a cross section taken along B-B of the module incorporating electronic component shown in FIG. 1.

An insulating resin 26 may be made of the same material as that of the insulating resin 25 on the substrate 1 in a position where the wiring pattern 2 is not formed. FIG. 4 is a schematic view of a cross section taken along B-B of the insulating resin 26 of the module incorporating electronic component shown in FIG. 1. As shown in FIG. 4, the insulating resin 26 is arranged on the substrate 1 such that its cross-sectional shape is rectangular or substantially rectangular, for example. Therefore, an area of a range of an interface between the sealing resin 4 and the insulating resin 26 (a length of a boundary line 26a×a length of the insulating resin 26 in a depth direction of the drawing) is larger than an area of a range of the interface between the sealing resin 4 and the substrate 1 (a length of a boundary line 1a×the length of the insulating resin 26 in the depth direction of the drawing) when it is assumed that the insulating resin 26 is not provided, so that even when adhesion strength between the sealing resin 4 and the insulating resin 26 per unit area is lower than the adhesion strength between the sealing resin 4 and the substrate 1 per unit area, the insulating resin 26 provided on the substrate 1 can further increase the bonding strength between the sealing resin 4 and the substrate 1.

Figure 5:
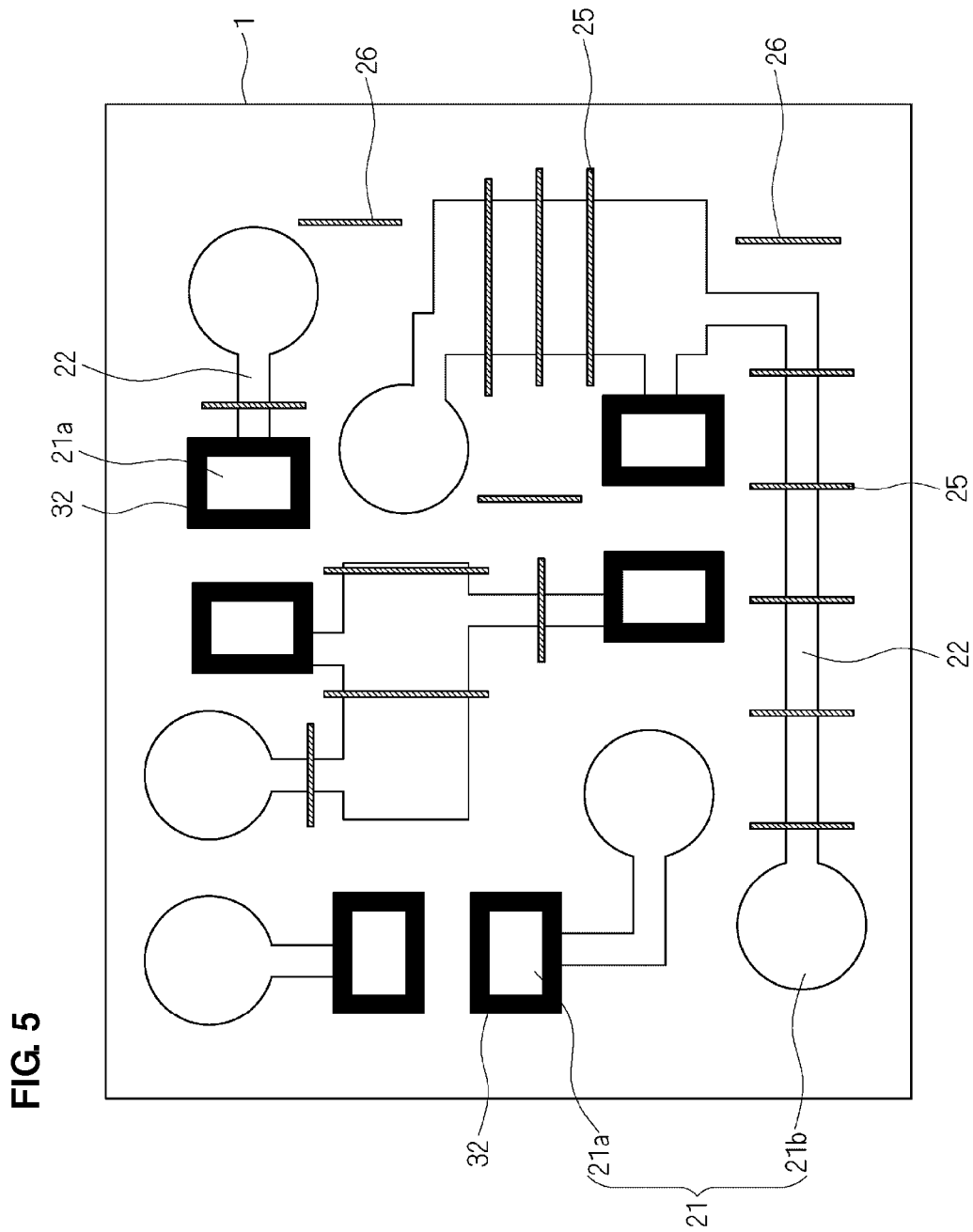
FIG. 5 is a plan view of another substrate of a module incorporating electronic component according to a preferred embodiment of the present invention.

The insulating resin 25 may be made of a solder resist, for example. FIG. 5 is a plan view of another substrate 1 of a module incorporating electronic component according to a preferred embodiment of the present invention. As shown in FIG. 5, on the substrate 1, the solder outflow prevention pattern 32 is preferably made of the solder resist, around the land electrode 21a (including a boundary between the land electrode 21a and the wiring electrode 22) electrically bonded to the electronic component 3. Furthermore, on the substrate 1, the solder resist is preferably used to define the insulating resin 25 disposed on the wiring electrode 22, and the insulating resin 26 disposed in the position where the wiring pattern 2 is not provided. Therefore, the insulating resins 25 and 26 can be formed in the same production step as a production step to form the solder outflow prevention pattern 32 on the substrate 1, which can reduce the production cost of the module incorporating electronic component according to the present preferred embodiment of the present invention. As the solder resist, for example, "PSR-4000 AUS308" produced by TAIYO INK CO., LTD. may be used.

As described above, in the module incorporating electronic component according to the present preferred embodiment of the present invention, the insulating resin 25 is provided on the wiring electrode 22 except for the boundary between the land electrode 21a and the wiring electrode 22, so as to cross at least one boundary between the substrate 1 and the wiring electrode 22, and the adhesion strength between the insulating resin 25 and the sealing resin 4 is preferably higher than the adhesion strength between the insulating resin 25 and the wiring pattern 2, so that the bonding strength between the sealing resin 4 and the substrate 1 can be increased. The insulating resin 25 is arranged so as to cross at least one boundary between the substrate 1 and the wiring electrode 22 in order to increase the bonding strength between the sealing resin 4 and the substrate 1, so that defects relating to solder, such as solder splash, are prevented from being generated at the interface between the sealing resin 4 and the substrate 1. Furthermore, since the insulating resin 25 is linearly arranged, the range of the interface between the sealing resin 4 and the insulating resin 25, and the interface between the insulating resin 25 and the wiring pattern 2 which are interfaces between different kinds of materials is limited, and defects relating to solder, such as solder splash, are prevented from being generated at the interface between the different kinds of materials.

An epoxy resin material can be used for the material of the insulating resins 25 and 26 other than the solder resist. Furthermore, the insulating resins 25, and 26 are to be disposed in a position in which the adhesion strength needs to be reinforced (such as a position near the wiring pattern 2 having a large area) in view of the wiring pattern 2 disposed on the substrate 1. Furthermore, in the module incorporating electronic component according to the present preferred embodiment of the present invention, even in the case where the electronic component 3 is bonded to both surfaces of the substrate 1, and the both surfaces are covered with the sealing resin 4, the insulating resin 25 is disposed on the wiring electrode 22 provided on the both surfaces of the substrate 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A module incorporating electronic component comprising:
   a substrate;
   a wiring pattern provided on at least one surface of the substrate;
   at least one electronic component electrically bonded to the wiring pattern and bonded to the substrate; and
   a sealing resin arranged to cover the at least one surface of the substrate including the bonded electronic component; wherein
   the wiring pattern includes:
      a plurality of land electrodes electrically bonded to the electronic component or to a via conductor; and
      a plurality of wiring electrodes arranged to connect the plurality of land electrodes;
   the plurality of land electrodes includes at least one first land electrode electrically bonded to the electronic component and at least one second land electrode electrically bonded to a via conductor; and
   an insulating resin is provided on every one of the plurality of wiring electrodes such that an adhesion strength between the insulating resin and the sealing resin is higher than an adhesion strength between the insulating resin and the wiring pattern.

2. The module incorporating electronic component according to claim 1, wherein the insulating resin has a linear shape configuration.

3. The module incorporating electronic component according to claim 1, wherein the insulating resin is arranged such that an area of an adhesion range with the substrate is larger than an area of an adhesion range with the plurality of wiring electrodes.

4. The module incorporating electronic component according to claim 1, wherein the insulating resin is also provided at a position on the substrate where the wiring pattern is not provided.

5. The module incorporating electronic component according to claim 1, wherein the insulating resin includes a solder resist.

6. A module incorporating electronic component comprising:
   a substrate;
   a wiring pattern provided on at least one surface of the substrate;
   at least one electronic component electrically bonded to the wiring pattern and bonded to the substrate; and
   a sealing resin arranged to cover the at least one surface of the substrate including the bonded electronic component; wherein
   the wiring pattern includes:
      a plurality of land electrodes electrically bonded to the electronic component or to a via conductor; and
      a plurality of wiring electrodes arranged to connect the plurality of land electrodes;
   the plurality of land electrodes includes at least one first land electrode electrically bonded to the electronic component and at least one second land electrode electrically bonded to a via conductor;
   an insulating resin;
   a solder outflow prevention pattern which is composed of the same material as the insulating resin and provided around at least a portion of the at least one first land electrode; and
   at least one of the insulating resin and the solder outflow prevention pattern is provided on every one of the plurality of wiring electrodes such that an adhesion strength between the insulating resin or the solder outflow prevention pattern and the sealing resin is higher than an adhesion strength between the insulating resin or the solder outflow prevention pattern and the wiring pattern.

7. The module incorporating electronic component according to claim 6, wherein the insulating resin has a linear shape configuration.

8. The module incorporating electronic component according to claim 6, wherein the insulating resin is arranged such that an area of an adhesion range with the substrate is larger than an area of an adhesion range with the plurality of wiring electrodes.

9. The module incorporating electronic component according to claim 6, wherein the insulating resin is also provided at a position on the substrate where the wiring pattern is not provided.

10. The module incorporating electronic component according to claim 6, wherein the insulating resin includes a solder resist.

* * * * *